United States Patent [19]
Lin et al.

[11] Patent Number: 5,897,352
[45] Date of Patent: Apr. 27, 1999

[54] METHOD OF MANUFACTURING HEMISPHERICAL GRAINED POLYSILICON WITH IMPROVED ADHESION AND REDUCED CAPACITANCE DEPLETION

[75] Inventors: Dahcheng Lin, Hsin-Chu; Jung-Ho Chang, Uen-Lin; Hsi-Chuan Chen, Tainan, all of Taiwan

[73] Assignee: Vanguard International Semiconductor Corporation, Hsin-Chu, Taiwan

[21] Appl. No.: 09/047,543

[22] Filed: Mar. 25, 1998

[51] Int. Cl.⁶ .................................................. H01L 21/8242
[52] U.S. Cl. .................................................. 438/255
[58] Field of Search .............................. 438/238, 239, 438/253–256, 381, 396–399

[56] References Cited

U.S. PATENT DOCUMENTS

| | | | |
|---|---|---|---|
| 5,340,763 | 8/1994 | Dennison | 437/52 |
| 5,407,534 | 4/1995 | Thakur | 156/662 |
| 5,444,653 | 8/1995 | Nagasawa et al. | 365/149 |
| 5,554,566 | 9/1996 | Lur et al. | 437/193 |
| 5,634,974 | 6/1997 | Weimer et al. | 117/103 |
| 5,658,381 | 8/1997 | Thakur et al. | 257/309 |
| 5,817,554 | 10/1998 | Tseng | 438/253 |
| 5,827,766 | 10/1998 | Lou | 438/253 |
| 5,849,624 | 12/1998 | Fazan et al. | 438/398 |

*Primary Examiner*—Joni Chang
*Attorney, Agent, or Firm*—George O. Saile; Stephen B. Ackerman

[57] ABSTRACT

A method for creating a stacked capacitor structure, with increased surface area, needed for high density, DRAM designs, has been developed. A storage node electrode, featuring a top surface of HSG polysilicon lumps, is used for the surface area increase. A feature of this invention is the use of a thin, heavily doped, polysilicon layer, formed on the HSG polysilicon lumps, resulting in improved adhesion between HSG polysilicon lumps and the underlying polysilicon storage node shape. The thin, heavily doped, polysilicon layer also supplies dopant to underlying HSG polysilicon lumps, needed to reduce a capacitor depletion phenomena which can occur if undoped HSG polysilicon lumps are used.

23 Claims, 5 Drawing Sheets

METHOD OF MANUFACTURING HEMISPHERICAL GRAINED POLYSILICON WITH IMPROVED ADHESION AND REDUCED CAPACITANCE DEPLETION

BACKGROUND OF THE INVENTION (1) Field of the Invention

The present invention relates to a method used to fabricate a capacitor structure for a dynamic random access memory, (DRAM) device, and more specifically to a method used to form a capacitor structure, featuring a hemispherical grain, (HSG), polysilicon layer.

(2) Description of the Prior Art

The semiconductor industry is continually striving to improve device performance, while still focusing on methods of reducing manufacturing costs. These objectives have been successfully addressed by the ability of the semiconductor industry to produce chips with sub-micron features, or micro-miniaturization. Sub-micron features allow the reduction in performance degrading capacitances and resistances to be realized. In addition the smaller features result in a smaller chip, however still possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller, or sub-micron features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 64 million cells per chip, or greater, has resulted in a specific cell in which a smaller transfer gate transistor is being used, resulting in less of an overlying area for placement of overlying STC structures.

One method of maintaining, or increasing STC capacitance, while still decreasing the lateral dimension of the capacitor, has been the use of rough, or hemispherical grain, (HSG), polysilicon layers. HSG polysilicon layers have been used as an overlying layer, on a conventional polysilicon structure, as shown by Dennison, in U.S. Pat. No. 5,340,763, and by Nagasawa, et al, in U.S. Pat. No. 5,444,653. The convex and concave features of the HSG polysilicon layer result in increases in capacitor surface area, without consuming additional device area, thus resulting in DRAM capacitance increases, when compared to counterparts fabricated with smooth capacitor surfaces. However several factors have limited the use of HSG layers, for DRAM applications. The presence of an unwanted thin native oxide, on an underlying polysilicon capacitor surface, can result in poor adhesion between the subsequent HSG polysilicon layer, and the underlying polysilicon capacitor. To alleviate the effect of the thin native oxide a high vacuum, in situ cleaning procedure, has to be used prior to HSG polysilicon deposition. In addition to increase the roughness feature of an HSG polysilicon layer, the dopant level of the HSG layer is maintained at a lower level than the dopant concentration in the underlying polysilicon capacitor. The dopant gradient established between the low dopant HSG polysilicon layer, and the higher dopant, underlying polysilicon capacitor, results in a capacitance depletion phenomena, reducing the advantage of the capacitance increase realized from the roughened surface HSG polysilicon layer. Again an additional processing step, a plasma treatment, is used to increase the dopant concentration in the HSG polysilicon layer.

This invention will describe a process for creating an HSG polysilicon layer, featuring improved adhesion between HSG polysilicon and the underlying polysilicon capacitor surface, and also featuring a reduction in the capacitance depletion phenomena. The HSG polysilicon layer, used in this invention results in the improved characteristics via the use of a thin, overlying, highly doped polysilicon layer, thus avoiding the use of a high vacuum, in situ clean, prior to HSG polysilicon deposition, as well as avoiding the additional plasma treatment, applied post HSG polysilicon deposition.

SUMMARY OF THE INVENTION

It is an object of this invention to create a stacked capacitor structure for a DRAM device, using a layer comprised of HSG polysilicon lumps, as part of a storage node electrode, to increase the surface area, and the capacitance of the stacked capacitor structure.

It is another object of this invention to create the a layer of HSG polysilicon lumps by growing HSG polysilicon seeds, on an amorphous silicon layer, followed by an in situ annealing procedure, used to convert the small HSG polysilicon seeds to an larger HSG polysilicon lumps.

It is still another object of this invention to deposit a thin, heavily doped, polysilicon layer on the HSG polysilicon lumps, to improve the adhesion of the HSG polysilicon lumps to the surface of the underlying storage node electrode, while also reducing the capacitor depletion phenomena, between the HSG polysilicon lumps and the underlying storage node electrode.

In accordance with the present invention a method for fabricating a STC structure, for a DRAM device, using a layer comprised of HSG polysilicon lumps, capped with a thin, heavily doped polysilicon layer, has been developed. A transfer gate transistors comprised of: a thin gate insulator; an insulator capped, polysilicon gate structure, formed from a first polysilicon layer; a lightly doped source and drain region; insulator spacers on the sides of the polysilicon gate structure; and a heavily doped source and drain region; are formed on a semiconductor substrate. An insulator layer, is next deposited, planarized, and followed by an opening of a storage node contact hole in the insulator layer, made to expose the source region of the transfer gate transistor. A second polysilicon layer is deposited, and doped, via use of in situ doping procedures, than patterned to form a lower portion of a storage node electrode, contacting the source region of the transfer gate transistor. An amorphous silicon layer is deposited on the second polysilicon layer, followed by a low temperature, low silane procedure, used to create HSG polysilicon seeds on the surface of the amorphous silicon layer. An anneal, in a pure nitrogen ambient, is then in situ performed, to convert the HSG polysilicon seeds to a layer, comprised of HSG polysilicon lumps. This is followed by the deposition of a third layer of polysilicon layer, with the third polysilicon layer being thin and heavily doped, capping the underlying HSG polysilicon lumps, and resulting in improved adhesion between the HSG polysilicon lumps and the lower portion of the storage node electrode. In addition a reduction in capacitor depletion, due to doping of the HSG polysilicon lumps, by the overlying third polysilicon layer, results. The creation of a capacitor dielectric layer, on the top portion of storage node electrode, comprised of the thin, heavily doped, polysilicon layer, on HGS polysilicon lumps, is followed by the formation of a capacitor plate electrode, completing the procedure used for fabrication of an STC structure, using an HSG polysilicon lumps for capacitance increases.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming an STC structure, for a DRAM device, featuring HSG polysilicon lumps, used to increase the capacitance of the STC structure, and using a thin heavily doped polysilicon layer, overlaying the HSG polysilicon lumps, for adhesion improvement between the HSG polysilicon lumps and the underlying storage node electrode, and for providing dopant to the HSG polysilicon lumps, needed to reduce a capacitor depletion effect, will now be described in detail. The transfer gate transistor, used for this DRAM device, in this invention, will be an N channel device. However the STC structure, with the increased surface area described in this invention, can also be applied to P channel, transfer gate transistor.

Figure 1:
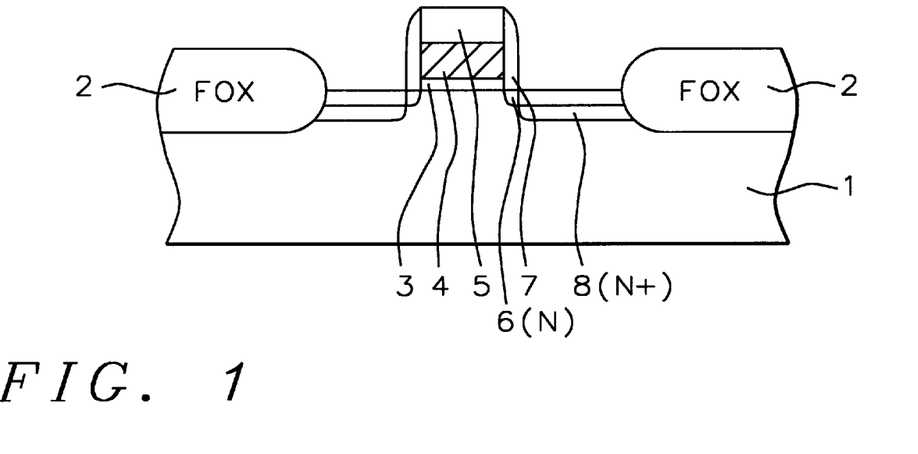
FIGS. 1–9, which schematically, in cross-sectional style, show the key fabrication stages used to create a a STC structure for a DRAM device, in which the top portion of a storage node electrode is comprised of a thin, heavily doped, polysilicon layer on HSG polysilicon lumps.

Referring to FIG. 1, a P type, semiconductor substrate 1, with a <100>, single crystalline orientation, is used. Field oxide, (FOX), regions 2, are used for purposes of isolation. Briefly the FOX regions 2, are formed via thermal oxidation, in an oxygen-steam ambient, at a temperature between about 900 to 1100° C., to a thickness between about 2000 to 5000 Angstroms. A patterned oxidation resistant mask of silicon nitride-silicon oxide is used to prevent FOX regions 2, from growing on areas of substrate 1, to be used for subsequent device regions. After the growth of the FOX regions 2, the oxidation resistant mask is removed via use of a hot phosphoric acid solution for the overlying, silicon nitride layer, and a buffered hydrofluoric acid solution for the underlying silicon oxide layer. After a series of wet cleans, a gate insulator layer 3, of silicon oxide is thermally grown in an oxygen-steam ambient, at a temperature between about 750 to 1050° C., to a thickness between about 40 to 200 Angstroms. A first polysilicon layer 4, is next deposited using low pressure chemical vapor deposition, (LPCVD), procedures, at a temperature between about 500 to 700° C., to a thickness between about 500 to 4000 Angstroms. The polysilicon can either be grown intrinsically and doped via ion implantation of arsenic or phosphorous, at an energy between about 10 to 80 KeV, at a dose between about 1E13 to 1E16 atoms/cm$^2$, or grown using in situ doping procedures, via the incorporation of either arsine or phosphine to the silane ambient. An alternative to polysilicon layer 4, is the use of a polycide layer, comprised of a metal silicide layer, such as tungsten silicide or titanium silicide, on an underlying polysilicon layer. A first insulator layer 5, comprised of silicon oxide, used as a cap insulator layer, is next grown via the use of either LPCVD or plasma enhanced chemical vapor deposition, (PECVD), procedures, to a thickness between about 600 to 2000 Angstroms. Conventional photolithographic and reactive ion etching, (RIE), procedures, using $CHF_3$ as an etchant for first insulator layer 5, and using $Cl_2$ as an etchant for polysilicon layer 4, are used to create the polysilicon gate structure, comprised of polysilicon layer 4, with overlying capping, first insulator layer 5, shown schematically in FIG. 1. Photoresist removal is accomplished via plasma oxygen ashing and careful wet cleans.

A lightly doped source and drain region 6, is next formed via ion implantation of phosphorous, at an energy between about 5 to 60 KeV, at a dose between about 1E13 to 1E15 atoms/cm$^2$. A second insulator layer, comprised of silicon oxide, is then deposited using either LPCVD or PECVD procedures, at a temperature between about 400 to 850° C., to a thickness between about 1500 to 4000 Angstroms, followed by an anisotropic RIE procedure, using $CHF_3$ as an etchant, creating insulator spacers 7, on the sides of the polysilicon, or polycide gate structure. A heavily doped source and drain region 8, is then formed via ion implantation of arsenic, at an energy between about 30 to 100 KeV, at a dose between about 1E14 to 5E16 atoms/cm$^2$. The result of these steps are also shown schematically in FIG. 1.

Figure 2:
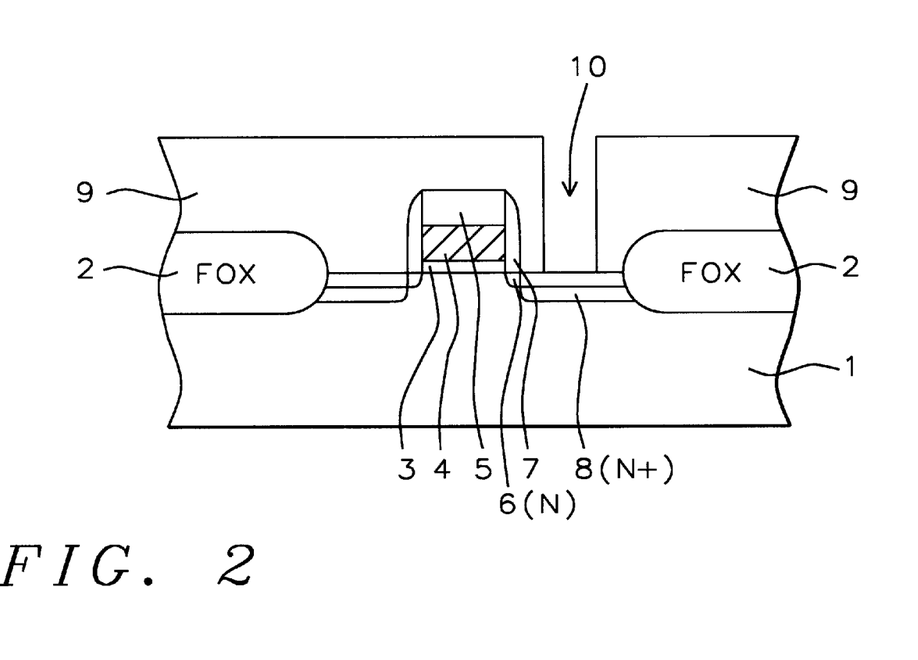

A third insulator layer 9, comprised of either silicon oxide, boro-phosphosilicate glass, (BPSG), or phosphosilicate glass, (PSG), is next deposited, using LPCVD or PECVD procedures, at a temperature between about 600 to 800° C., to a thickness between about 3000 to 10000 Angstroms. Insulator layer is grown using tetraethylorthosilicate, (TEOS) as a source with the addition of either diborane and phosphine, for the BPSG layer, or the addition of only phosphine, for the PSG layer. Insulator layer 9, is then planarized using chemical mechanical polishing, to provide a smoother surface for subsequent depositions and patterning procedures. Conventional photolithographic and RIE procedures, using $CHF_3$ as an etchant, are used to open storage node contact hole 10, in third insulator layer 9, exposing the top surface of heavily doped source and drain region 8. Photoresist removal is performed via use of plasma oxygen ashing and careful wet cleans. The result of these procedures are schematically shown in FIG. 2.

Figure 3:
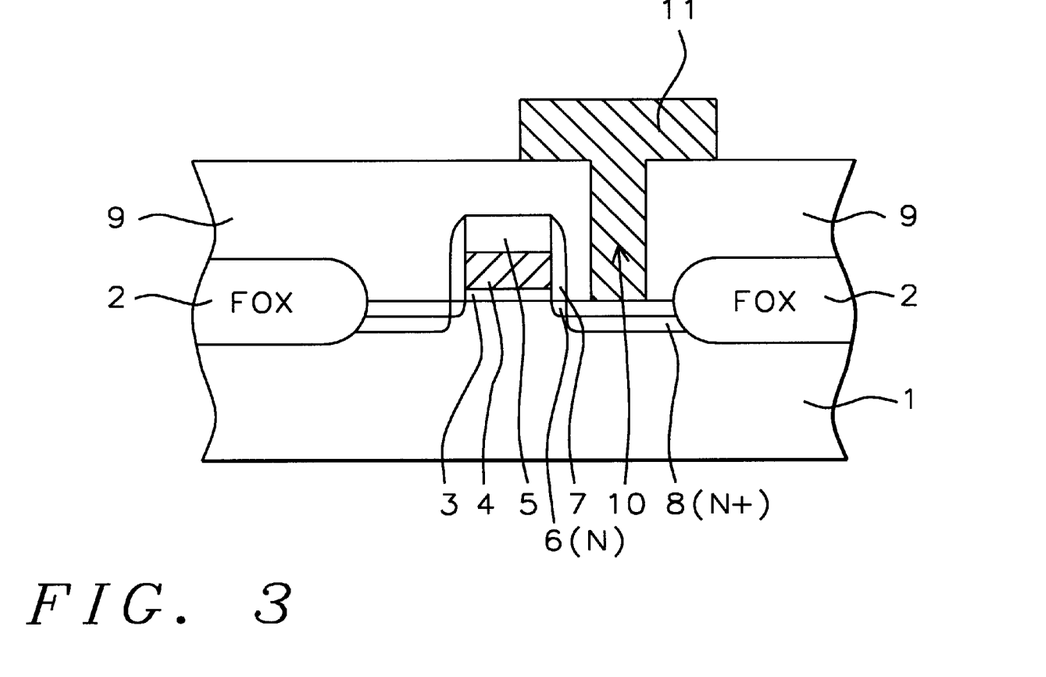

Referring to FIG. 3, a polysilicon layer is deposited, via LPCVD procedures, at a temperature between about 500 to 700° C., to a thickness between about 1000 to 10000 Angstroms, completely filling storage node contact hole 10. The polysilicon layer can be deposited intrinsically and doped via ion implantation of either phosphorous or arsenic, or the polysilicon layer can be deposited using an in situ doping procedure, via the addition of either phosphine or arsine, to a silane ambient. Photolithographic and RIE procedures, using $Cl_2$ as an etchant, are used to pattern the polysilicon layer, creating polysilicon shape 11, which will be used as the top portion of a subsequent storage node electrode.

Figure 4:
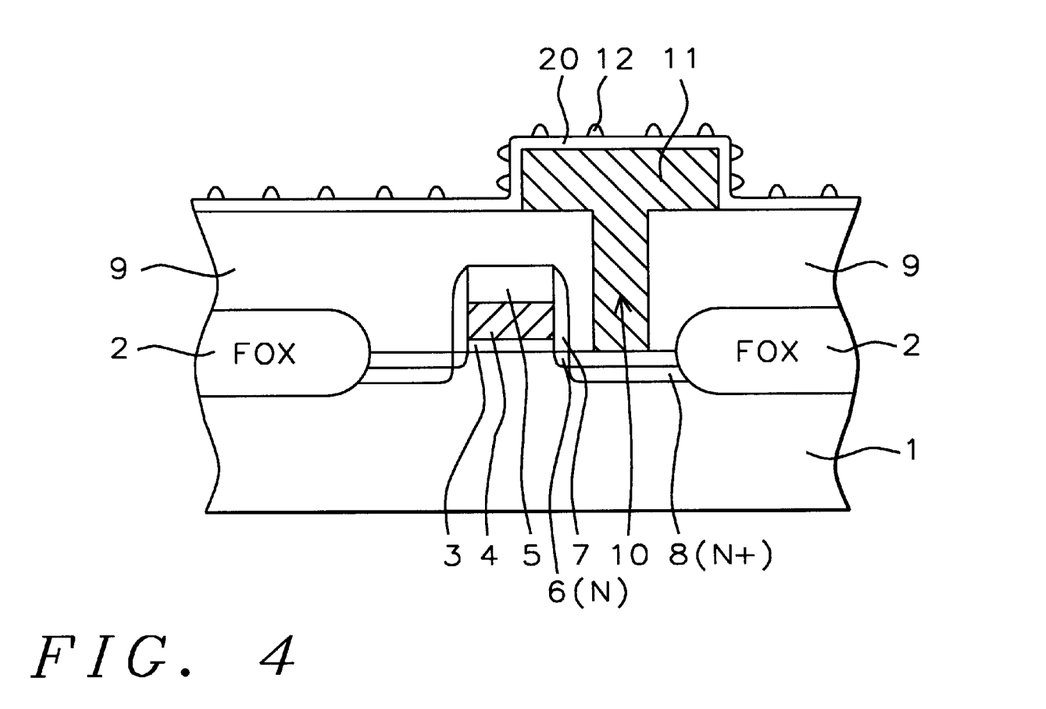

After removal of the masking photoresist layer, via plasma oxygen ashing and careful wet cleans, an amorphous silicon layer 20, is deposited using a LPCVD procedure, at a temperature between about 500 to 550° C., to a thickness between about 50 to 1000 Angstroms. Amorphous silicon layer 20, shown schematically in FIG. 4, is grown in a silane, or in a dichlorosilane ambient, in situ doped during deposition via the addition of phosphine to a level resulting in a surface concentration for amorphous silicon layer 20, below 4E20 atoms/cm$^3$. Next HSG polysilicon seeds 12, are formed on the surface of amorphous silicon layer 20, in an LPCVD furnace, via the decomposition of silane, or dichlorosilane, injected at a low concentration, less than 1.0E-3 moles/m$^3$, using a nitrogen flow as a diluting gas, at a temperature between about 550 to 580° C., and for a time between about 5 to 60 min. The HSG polysilicon seeds 12, are schematically shown in FIG. 4. An anneal, performed in situ, in the same LPCVD furnace that was used to grow HSG polysilicon seeds 12, is used to create convert HSG polysilicon seeds 12, to a discontinuous layer, comprised of HSG polysilicon lumps 22, shown schematically in FIG. 5. The annealing procedure is accomplished using pure nitrogen gas, at a temperature between about 550 to 580° C., for a time between about 10 to 120 min., resulting in HSG polysilicon lumps 22, having a thickness between about 200 to 800 Angstroms.

Figure 5:
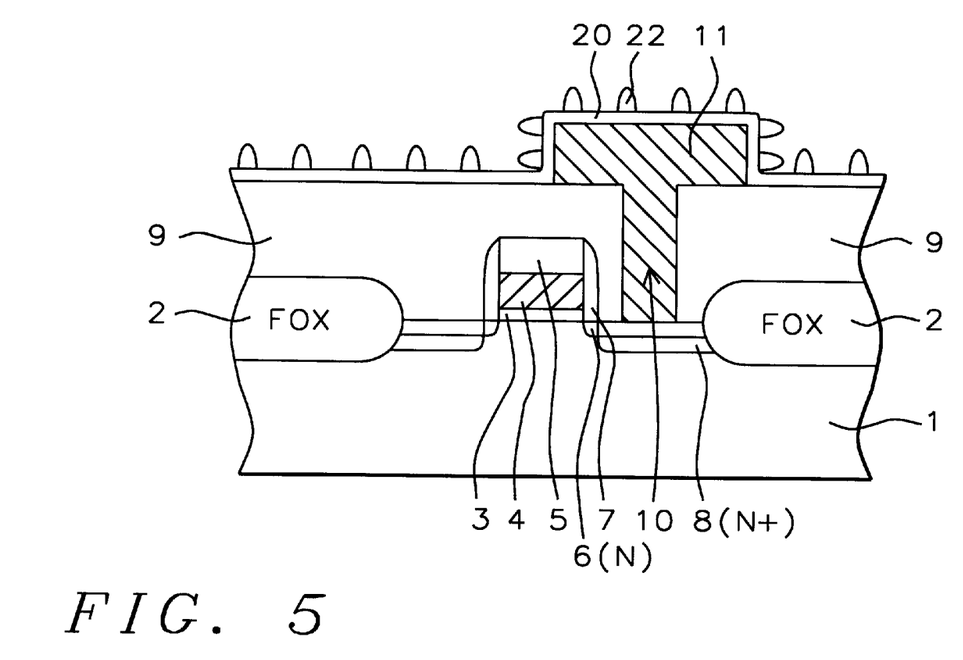
Figure 6:
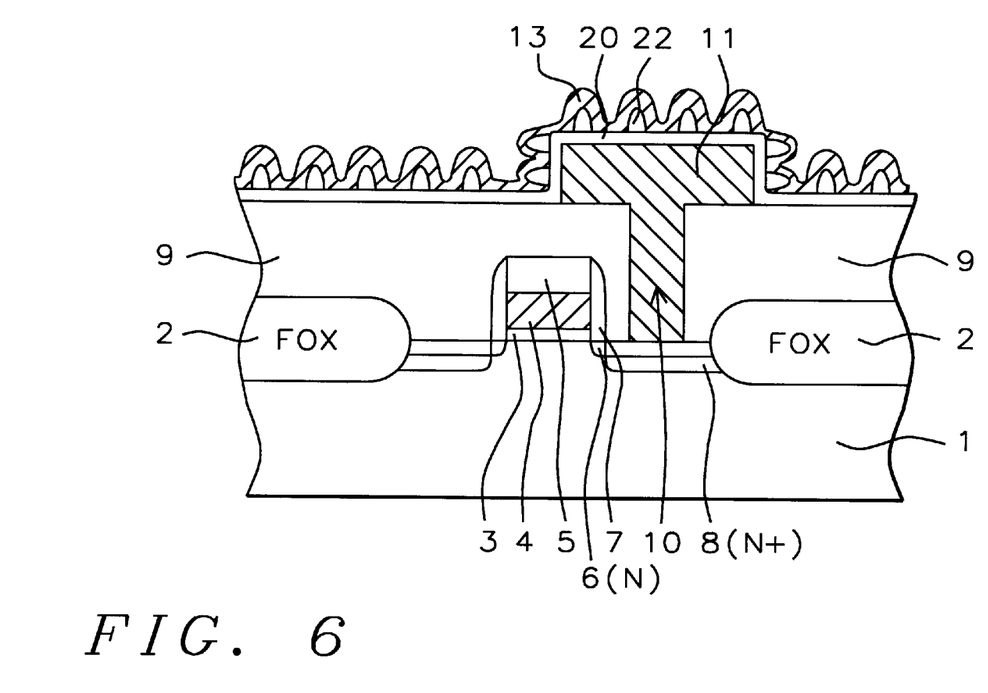

HSG polysilicon lumps 22, shown schematically in FIG. 5, have a small contact area for adhesion to underlying surfaces, and therefore may present yield or reliability problems when overlaid with a capacitor dielectric layer. In addition the intrinsically grown HSG polysilicon seeds 12, and HSG polysilicon lumps 22, are only doped via diffusion from amorphous layer 20, and therefore can present a performance concern, in terms of capacitor depletion. Therefore to alleviate the adhesion and capacitor depletion concerns, a thin, highly doped, polysilicon layer 13, is deposited, in the same LPCVD furnace that was previously used to grow HSG polysilicon seeds 12, and to form HSG polysilicon lumps 22. Polysilicon layer 13, schematically shown in FIG. 6, is deposited at a temperature between about 500 to 700° C., using silane, or dichlorosilane, and phosphine, in a nitrogen ambient, to a thickness between about 20 to 400 Angstroms. The surface concentration of polysilicon layer 13, is above 4E20 atoms/cm$^3$. Polysilicon layer 13, now encapsulates HSG polysilicon lumps 22, while interfacing underlying amorphous layer 20, between HSG polysilicon lumps 22, providing improved adhesion. In addition the subsequent diffusion from polysilicon layer 13, to the HSG polysilicon lumps, will increase the N type doping level of the HSG polysilicon lumps, thus reducing the capacitor depletion concern.

Although this description features the encapsulation of HSG polysilicon lumps 22, using HSG polysilicon lumps that are formed from HSG polysilicon seeds 12, other forms of rough or HSG type polysilicon features, experiencing subsequent encapsulation by thin, highly doped polysilicon layer 13, can be formed without the use of previously formed HSG polysilicon seeds. For example HSG lumps can be formed by deposition of an amorphous silicon layer, followed by a ramp up in temperature to between about 610 to 630° C., performed in situ in the deposition furnace. HSG polysilicon lumps 22, can also be formed via direct deposition at a temperature between about 570 to 590° C.

Figure 7:
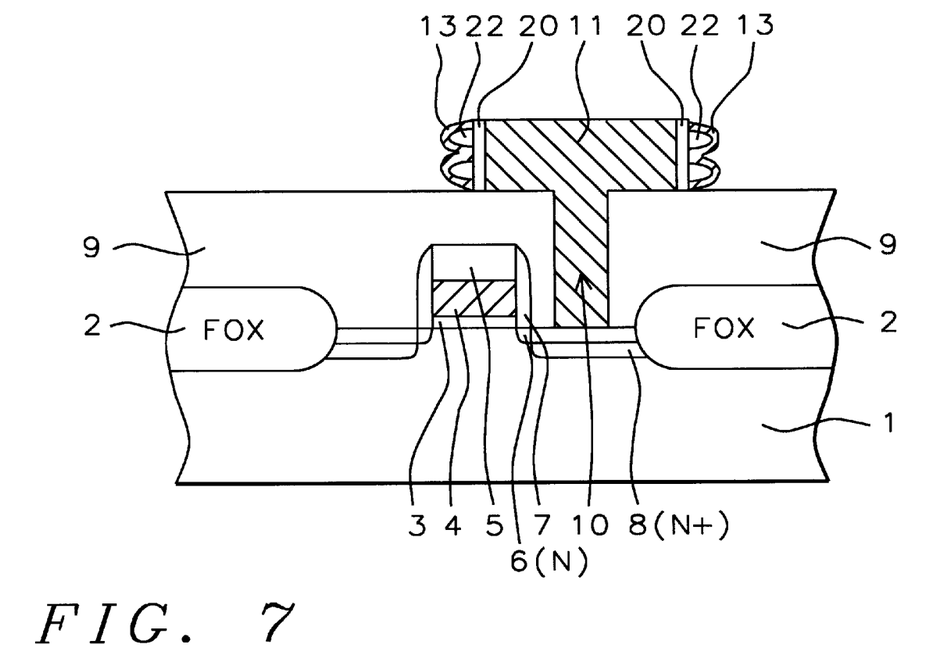
Figure 8:
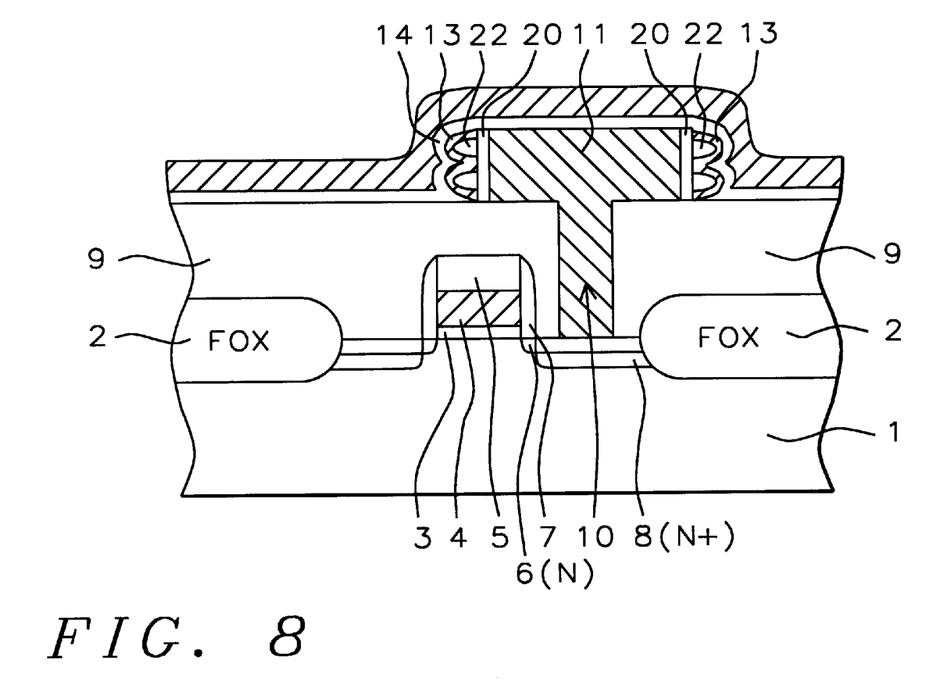
Figure 9:
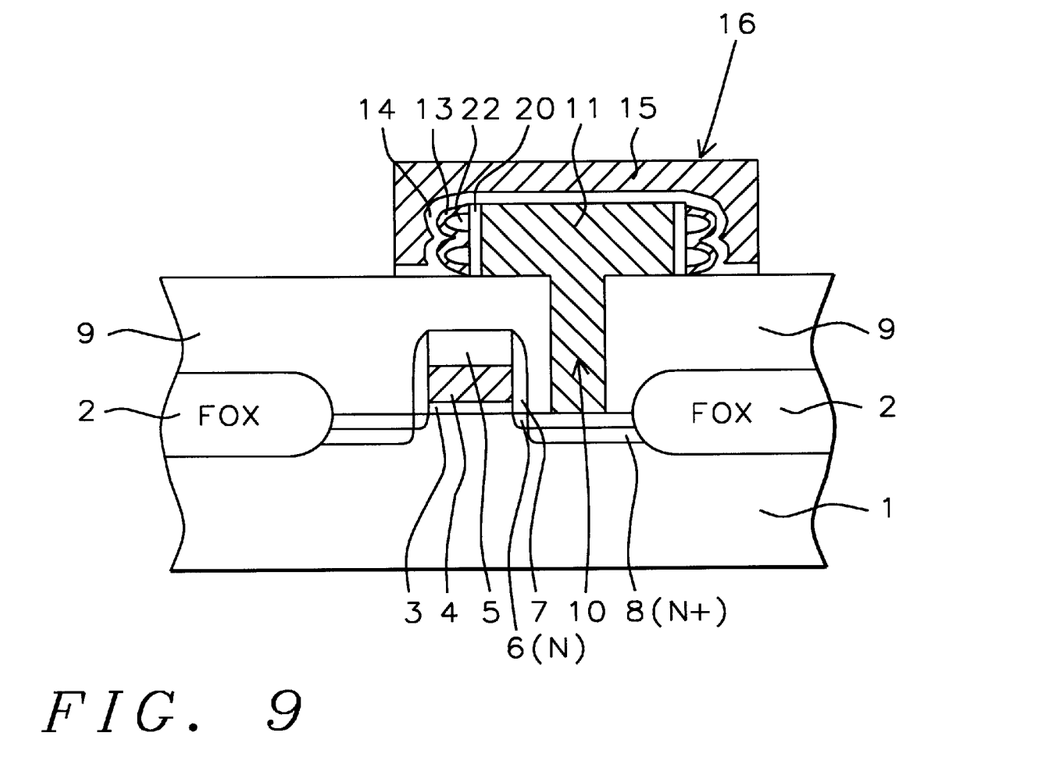

An anisotropic RIE procedure, is next performed to remove HSG polysilicon lumps 22, and amorphous silicon layer 20, from the top surface of polysilicon shape 11, as well as from the top surface of insulator layer 9. This is accomplished using Cl$_2$ as an etchant, and shown schematically in FIG. 7. A capacitor dielectric layer 14, exhibiting a high dielectric constant, such as Ta$_2$O$_5$, is next created, including formation on the sides of polysilicon shape 11, roughened via the inclusion of HSG polysilicon lumps 22. The Ta$_2$O$_5$ layer is obtained via r.f sputtering techniques, or chemical vapor deposition procedures, at an equivalent silicon dioxide thickness between about 40 to 120 Angstroms. Capacitor dielectric layer 14, can also be ONO, (Oxidized—silicon Nitride—silicon Oxide), or a nitride—oxide, (NO), layer. The ONO layer is formed by initially growing a silicon dioxide layer, on the thin, heavily doped, polysilicon layer 13, between about 0 to 50 Angstroms, followed by the deposition of a silicon nitride layer, between about 10 to 100 Angstroms. Subsequent thermal oxidation of the silicon nitride layer results in the formation of a silicon oxynitride layer on silicon oxide, at a silicon oxide equivalent thickness of between about 40 to 120 Angstroms. Another polysilicon layer 15, is deposited, via LPCVD procedures, at a temperature between about 500 to 700° C., to a thickness between about 500 to 4000 Angstroms. Doping of polysilicon layer 15, is accomplished via an situ doping deposition procedure, by the addition of phosphine, to the silane ambient. The results of these procedures are schematically shown in FIG. 8. Finally photolithographic and RIE procedures, using Cl$_2$ as an etchant, are next employed to pattern polysilicon layer 15, creating the upper electrode, or plate electrode, shown schematically in FIG. 9. The patterning procedure also forms the top portion of the storage node electrode by removing capacitor dielectric layer 14, from regions not covered by STC structure 16. This is schematically shown in FIG. 9. Photoresist is again removed via plasma oxygen ashing and careful wet cleans.

While this invention has been particularly shown and described with reference to the preferred embodiments thereof, it will be understood by those skilled in the art that various changes in form and details may be made without departing from the spirit and scope of this invention.

What is claimed is:

1. A method for fabricating a stacked capacitor structure, for a DRAM device, on a semiconductor substrate, comprising the steps of:

providing a transfer gate transistor, on said semiconductor substrate, comprised of a polysilicon gate structure, on a gate insulator layer, with a source and drain region in regions of said semiconductor substrate, not covered by said polysilicon gate structures;

creating a storage node contact hole, in a first insulator layer, exposing a top surface of a source region;

forming a bottom portion of a storage node electrode, on a top surface of said first insulator layer, and completely filling said storage node contact hole;

depositing an amorphous silicon layer;

growing hemispherical grain, (HSG), polysilicon seeds on a surface of said amorphous silicon layer;

annealing of said HSG polysilicon seeds to form HSG polysilicon lumps;

depositing a thin, heavily doped, polysilicon layer on said HSG polysilicon lumps, and on regions of said amorphous silicon layer, not covered by said HSG polysilicon lumps;

removing said thin, heavily doped, polysilicon layer, said HSG polysilicon lumps, and said amorphous silicon layer, from a top surface of said bottom portion of said storage node electrode, and from the top surface of said first insulator layer;

forming a capacitor dielectric layer;

depositing a polysilicon layer; and patterning of said polysilicon layer to form an upper electrode for said stacked capacitor structure.

2. The method of claim 1, wherein a polysilicon layer, used for said bottom portion of said storage node electrode, is deposited using LPCVD procedures, at a temperature between about 500 to 700° C., to a thickness between about 1000 to 10000 Angstroms, and doped via an in situ doping deposition procedure, or via an ion implantation procedure using either arsenic or phosphorous.

3. The method of claim 1, wherein said amorphous silicon layer is deposited at a temperature between about 500 to 550° C., to a thickness between about 50 to 1000 Angstroms, in a silane, or in a dichlorosilane ambient, and in situ doped, via the addition of phosphine, resulting in a surface concentration for said amorphous silicon layer of less then 4E20 atoms/cm$^3$.

4. The method of claim 1, wherein said HSG polysilicon seeds are grown in an LPCVD furnace, at a temperature between about 550 to 580° C., using a silane, or a dichlorosilane gas, in a nitrogen ambient, with a concentration less than 1.0E-3 moles/m$^3$.

5. The method of claim 1, wherein said HSG polysilicon lumps are created by annealing of said HSG seeds, at a temperature between about 550 to 580° C., in nitrogen ambient, for a time between about 10 to 120 min., with said HSG polysilicon lumps formed at a thickness between about 200 to 800 Angstroms.

6. The method of claim 1, wherein said thin, heavily doped, polysilicon silicon layer, is deposited using LPCVD procedures, at a temperature between about 500 to 700° C., to a thickness between about 20 to 400 Angstroms, using silane, or dichlorosilane, and phosphine, resulting in a surface concentration for said thin, heavily doped, polysilicon layer, greater than 4E20 atoms/cm$^3$.

7. The method of claim 1, wherein said capacitor dielectric layer is $Ta_2O_5$, deposited using R.F. sputtering, or chemical vapor deposition procedures, to an equivalent silicon dioxide thickness between about 40 to 120 Angstroms.

8. The method of claim 1, wherein said capacitor dielectric layer is ONO, or NO, at an equivalent silicon dioxide thickness between about 40 to 80 Angstroms, created by an initial thermal oxidation of said thin, heavily doped, polysilicon layer, to form a silicon dioxide layer, between about 0 to 50 Angstroms, followed by a deposition of silicon nitride, to a thickness between about 10 to 100 Angstroms, and thermal oxidation of said silicon nitride layer, creating a silicon oxynitride layer, on the underlying, said silicon dioxide layer.

9. The method of claim 1, wherein said upper electrode, of said stacked capacitor structure, is formed via patterning of said polysilicon layer, via an anisotropic RIE procedure, using $Cl_2$ as a etchant.

10. The method of claim 1, wherein top portion of said storage node electrode, is formed via patterning of said thin, heavily doped, polysilicon layer, of said HSG polysilicon lumps, and of said amorphous silicon layer, via anisotropic RIE procedures, using $Cl_2$ as an etchant.

11. A method of fabricating a storage node electrode, for a DRAM, stacked capacitor structure, in which a surface area of the storage node electrode is increased via use of hemispherical grain, (HSG), polysilicon lumps, encapsulated by a thin, heavily doped, polysilicon layer, on a top surface of the storage node electrode, comprising the steps of:

providing a transfer gate transistor on a semiconductor substrate, comprised of a polysilicon gate structure, on an underlying gate insulator layer, and with source and drain region in said semiconductor substrate;

depositing a first insulator layer on said transfer gate transistor;

planarizing said first insulator layer;

opening a storage node contact hole in said first insulator layer, exposing a top surface a source region, in said transfer gate transistor;

depositing a first polysilicon layer on top surface of said first insulator layer, and completely filling said storage node contact hole;

patterning of said first polysilicon layer to form a bottom portion of said storage node electrode;

depositing an amorphous silicon layer;

growing HSG polysilicon seeds on a surface of said amorphous silicon layer, in an LPCVD furnace;

annealing to convert said HSG polysilicon seeds to a layer of said HSG polysilicon lumps, in said LPCVD furnace;

depositing said thin, heavily doped, polysilicon layer, on said HSG polysilicon lumps, and on regions of said amorphous silicon layer, not covered by said HSG polysilicon lumps, in said LPCVD furnace;

removing said thin, heavily doped, polysilicon layer, said HSG polysilicon lumps, and said amorphous silicon layer, from a top surface of said bottom portion of said storage node electrode, and from the top surface of said first insulator layer;

forming a capacitor dielectric layer;

depositing a second polysilicon layer; and patterning of said second polysilicon layer to form upper electrode structure, for said stacked capacitor structure.

12. The method of claim 11, wherein said first insulator is silicon oxide, deposited using PECVD or LPCVD procedures, to a thickness between about 3000 to 10000 Angstroms, and planarized using a chemical mechanical polishing procedure.

13. The method of claim 11, wherein said first polysilicon layer is obtained via LPCVD procedures, at a temperature between about 500 to 700° C., to a thickness between about 1000 to 10000 Angstroms, with said first polysilicon layer doped N type, using a deposition procedure incorporating an in situ doping procedure, or doped via ion implantation procedures, using arsenic or phosphorous ions.

14. The method of claim 11, wherein said bottom portion of said storage node electrode is formed via anisotropic RIE procedures, applied to said first polysilicon layer, using $Cl_2$ as an etchant.

15. The method of claim 11, wherein said amorphous silicon layer is deposited using an LPCVD procedure, at a temperature between about 500 to 550° C., to a thickness between about 50 to 1000 Angstroms, and doped during an in situ deposition procedure, via an addition of phosphine, to a silane ambient, resulting in said amorphous silicon layer with a surface concentration of less then 4E20 atoms/cm$^3$.

16. The method of claim 11, wherein said HSG polysilicon seeds are grown in said LPCVD furnace, at a temperature between about 550 to 580° C., using a silane, or dichlorosilane gas, in a nitrogen ambient, with a concentration less than 1.0E-3 mole/m$^3$.

17. The method of claim 11, wherein said HSG polysilicon lumps are formed via annealing of said HSG polysilicon seeds, in said LPCVD furnace, in a pure nitrogen ambient, at a temperature between about 550 to 580° C., for a time between about 10 to 120 min., resulting said HSG polysilicon lumps at a thickness between about 200 to 800 Angstroms.

18. The method of claim 11, wherein said thin, heavily doped, polysilicon layer, is depositing using an LPCVD procedure, in said LPCVD furnace, at a temperature between about 500 to 700° C., in situ doped by adding phosphine to a silane, or dichlorosilane ambient, resulting in said thin, heavily doped polysilicon layer, at a thickness between about 20 to 400 Angstroms, and with a surface concentration greater than 4E20 atoms/cm$^3$.

19. The method of claim 11, wherein said capacitor dielectric layer is ONO, or NO, with an equivalent silicon dioxide thickness between about 40 to 80 Angstroms, created by growing a thin silicon oxide layer on said thin, heavily doped, polysilicon layer, at a thickness between about 0 to 50 Angstroms, depositing between about 10 to 100 Angstroms of a silicon nitride layer, and oxidizing said silicon nitride layer to from a silicon oxynitride layer on said thin silicon oxide layer.

20. The method of claim 11, wherein said capacitor dielectric layer is $Ta_2O_5$, deposited using R.F. sputtering, or chemical vapor deposition procedures, to an equivalent silicon dioxide thickness between about 40 to 120 Angstroms.

21. The method of claim 11, wherein said second polysilicon layer is deposited using LPCVD procedures, at a temperature between about 500 to 700° C., to a thickness between about 500 to 4000 Angstroms.

22. The method of claim 11, wherein said upper polysilicon electrode structure is created via RIE of said second polysilicon layer, using $Cl_2$ as an etchant.

23. The method of claim 11, wherein a top portion of said storage node electrode is formed via an anisotropic RIE procedure, applied to said thin, heavily doped, polysilicon layer, to said HSG polysilicon lumps, and to said amorphous silicon layer, using $Cl_2$ as an etchant.

* * * * *